United States Patent [19]
DeShazo et al.

[11] Patent Number: 5,608,259
[45] Date of Patent: Mar. 4, 1997

[54] REVERSE CURRENT FLOW PREVENTION IN A DIFFUSED RESISTOR

[76] Inventors: Thomas R. DeShazo, 215 Kingwood Rd., Frenchtown, N.J. 08825; Raymond L. Giordano, 219 Thatcher Hill Rd., Flemington, N.J. 08822; Donald R. Preslar, 750 River Rd., Somerville, N.J. 08876

[21] Appl. No.: 204,718

[22] Filed: Mar. 2, 1994

[51] Int. Cl.[6] ................................................ H01L 29/00
[52] U.S. Cl. ............................ 257/547; 257/540; 257/546
[58] Field of Search ................................. 257/547, 540, 257/546

[56] References Cited

U.S. PATENT DOCUMENTS

| 3,430,110 | 2/1969 | Goshgarian | 257/536 |
| 4,085,382 | 4/1978 | Barber et al. | 257/547 |
| 4,117,507 | 9/1978 | Pacor | 257/547 |

Primary Examiner—Carl Whitehead, Jr.
Attorney, Agent, or Firm—Joel I. Rosenblatt

[57] ABSTRACT

An IC is constructed with deep layers preventing current flow due to parasitic transistors formed within the IC. Reverse current in case of voltage source polarity reversal is prevented by means of the reverse bias diodes formed by the addition of a P+ ring, and N+ well, for the embodiment disclosed.

8 Claims, 3 Drawing Sheets

REVERSE CURRENT FLOW PREVENTION IN A DIFFUSED RESISTOR

FIELD OF THE INVENTION

This invention relates to the field of integrated circuits using combinations of P and N material, required to be connected to a voltage source in a defined polarity and where reversal of that polarity would cause damage. In particular it defines a structure for the IC which prevents short circuit current flowing and damage to the IC in the event polarity to the IC is reversed.

BACKGROUND OF THE INVENTION

Integrated circuits ("ICs") as well known in the art employ regions of silicon which are doped to form material of different conductivity type polarity such as P type and N type material. Additionally, the P and N type material may be doped to different concentration levels to control conductivity, as known to those skilled in the art.

P or N material isolation layers, isolate the electrical circuit formed on P or N substrate material, from the other separate semiconductor materials forming the electrical components. As is well known, the various combinations of P and N material forming the electric circuits and the substrate also form parasitic circuits such as parasitic transistors. Further, the IC may be required to be connected to a voltage source in a defined polarity. In this case, reversal of the polarity may cause damage to the IC such as by high reverse bias current.

It is desirable to find a way to construct an IC so that reversal of the power source polarity to the IC would not cause damage by producing a high reverse bias current. It is desirable to construct the IC so reverse bias current is prevented at all times in the event of polarity reversal and where this safeguard is part of, and cannot be removed, from the IC.

A material such as a P type material serving as a diffused resistor for example, in an integrated circuit may be mounted in a material of opposite polarity such as an N epi material. The opposite polarity material serves as an isolating material, isolating the P type material from other P type materials and from a P type substrate within an integrated circuit. Where that structure, including the materials at two different polarities are mounted in a substrate, for example having the same polarity as the first material, such as the P material forming a diffused resistor, a parasitic transistor is produced. To avoid parasitic currents through that parasitic transistor a direct connection is made from the first polarity material such as the P material, to the second polarity material such as the N epi material serving as an isolation layer. In this way, bias to the parasitic resistor was prevented and parasitic currents were avoided.

In the prior art example shown, the first material is P+ material serving as a diffused resistor within an integrated circuit. It is mounted in N epi material serving as an isolation layer. The substrate for the integrated circuit is formed of P material. The parasitic transistor formed of the P+ diffused resistor material, the N epi material, and the P substrate is prevented from conducting a leakage current by a direct short connection from the P+ diffused resistor material to the N epi material serving as the base and preventing bias from forming in the parasitic transistor.

It is this short connection that creates a possibility of reverse bias current when the polarity is reversed to the diffused resistor, for example applying negative polarity to the diffused resistor and positive polarity to the substrate. As would be understood by those skilled in the art, the P substrate and the N epi material form a PN junction. This PN junction would then be shorted by a direct connection to the negative terminal of the battery under such a reverse polarity connection by the direct connection described above from the N epi material to the P+ diffused resistor material which is made to prevent leakage current through the parasitic transistor described above.

SUMMARY OF THE INVENTION

The inventive principles as shown in the preferred embodiment are disclosed in a novel IC construction which prevents short circuit current in the event polarity is reversed. In the preferred embodiment, chosen to serve as an example of the inventive principles, is disclosed a P+ resistor and N epi material. In the prior art, construction of such an IC, a buried layer between the N epi material and the P substrate reduced migration of current flow from the P+ material through the N epi material to the substrate due to parasitic transistor leakage current. A parasitic PNP transistor is formed by the P+ material, the N epi material and the P substrate. A prior art convention for preventing this leakage current was to electrically connect the P+ material to the N epi material effectively putting the base and the emitter at the same potential and preventing base current, or alternately to electrically connect the N epi material to a voltage source which is more positive than the voltage appearing at either terminal of the P+ material forming the resistor, such that the emitter base terminals of the parasitic transistor are reverse-biased.

The substrate such as the P substrate as shown in the prior art example, was grounded and the positive voltage V+ or the battery voltage was then applied to one end of the P+ resistor.

Reversal of the voltage applied to the prior art IC would cause reverse bias current to flow from the P substrate through the N epi material and through the short circuit N epi to P+ resistor, material to ground. The danger, as in any short circuit current, is damage to the IC.

The inventive principles as shown in the preferred embodiment disclose a construction which prevents short circuit current in the case of polarity reversal. As shown by way of example in the preferred embodiment, a P+ ring and a deep N+ ring which is driven to reach the buried N+ layer to form a well are added to the IC. Additionally, the short circuit connection between the P+ and the N epi material is removed, removing the base to emitter short circuit in the parasitic transistor. The parasitic transistor is prevented from conducting current by the novel construction of the IC as explained below.

Carriers injected into the N epi by the P+ material used to form the resistor and acting as the emitter of the parasitic transistor have insufficient lifetimes to pass through the high concentration N+ buried layer and the deep N+ ring or well to reach the P substrate or P+ isolation regions in large numbers and current into the ground connection to the substrate is minimized. The P+ ring which is placed between the P+ resistor and the deep N+ ring acts as a collector for these carriers. The P+ ring and N+ ring are electrically connected so that the N epi becomes biased at a potential only slightly below the most positive potential applied to the P+ resistor, limiting current through the parasitic transistor.

These and other features of the invention will clearly be seen in the description of the preferred embodiment which follows.

DESCRIPTION OF THE DRAWINGS

FIG. 2c. is a schematic of the P+ resistor construction shown in FIG. 2a. and FIG. 2b.

DESCRIPTION OF PREFERRED EMBODIMENT

Figure 1A:
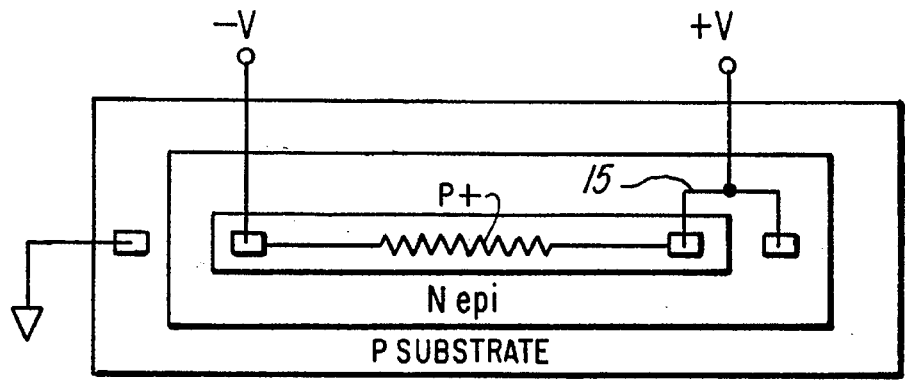
FIG. 1a. shows a top view of the prior art P+ resistor located in an N epi material and located in a P substrate.
Figure 1B:
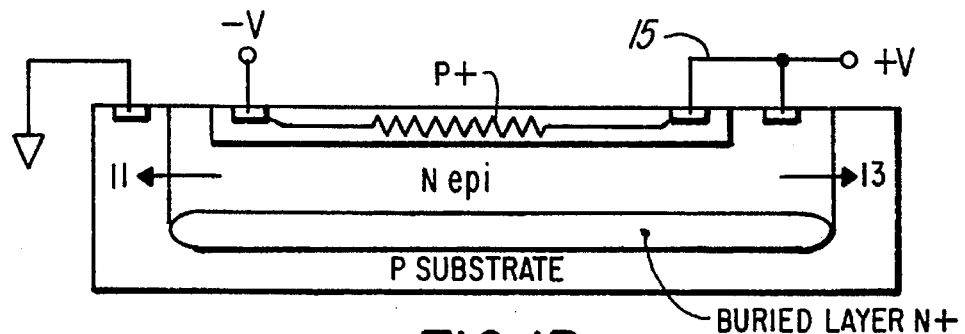
FIG. 1b. is a side view of the prior art P+ resistor of FIG. 1a. showing the N+ buried layer.
Figure 1C:
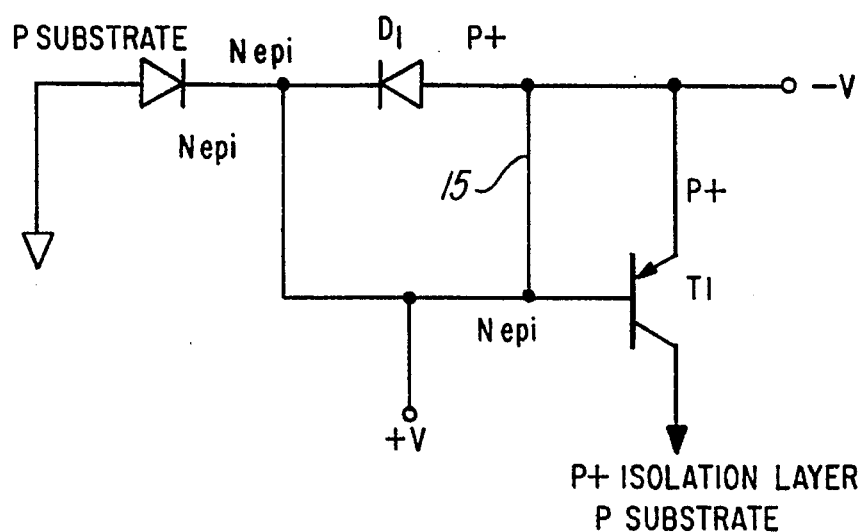
FIG. 1c. is a schematic of the prior art P+ resistor of FIGS. 1a. and 1b.

FIG. 1a, 1b, and 1c show the prior art method of constructing an IC such as for example the P+ resistor shown in the preferred embodiment. As shown in the prior art, a P+ resistor is located within N epi material. That combination of P+ resistor and N epi isolation material is located in a P substrate for isolation. A P+ isolation layer may provide additional isolation, A top view of such an IC is shown in FIG. 1a and a side view is shown in 1b. As shown in FIG. 1b, a Buried N+ layer located between the P substrate and the N epi layer prevents high levels of carrier flow from the P+ material through the N epi material to the P substrate as well known to those skilled in the art. However, in the prior art, side current may flow from the P+ material through N epi material to the P substrate in the site regions, as shown by the arrows 11 and 13.

A schematic of the IC shown in FIGS. 1A and 1B is shown in FIG. 1C. As shown, a diode $D_1$ is formed of the P substrate and the N epi material. A parasitic PNP resistor T1 formed of the P+ resistor material, the N epi material and the P+ isolation layer and P substrate. Current is prevented from flowing through the parasitic transistor, as shown in the prior art by the short connection from the N epi material to the P+ resistor, shorting the parasitic transistor T1's base to emitter and preventing any bias to the base emitter junction of the parasitic transistor T1.

Figure 2A:
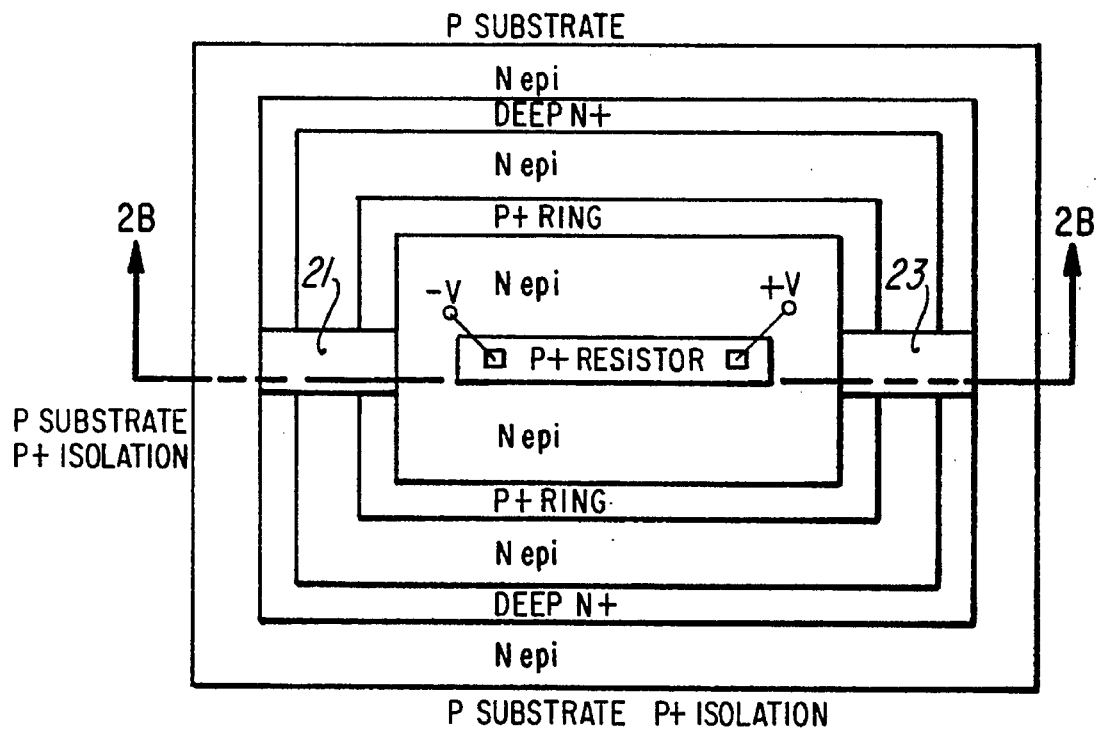
FIG. 2a. is a top view of the preferred embodiment showing the inventive principles, in particular the P+ resistor located in an N epi material surrounded by a P+ ring, which is surrounded by a well formed of a deep N+ ring and N+ buried layer, directly connected to the P+ ring and all of which is located in a P substrate for isolation.
Figure 2B:
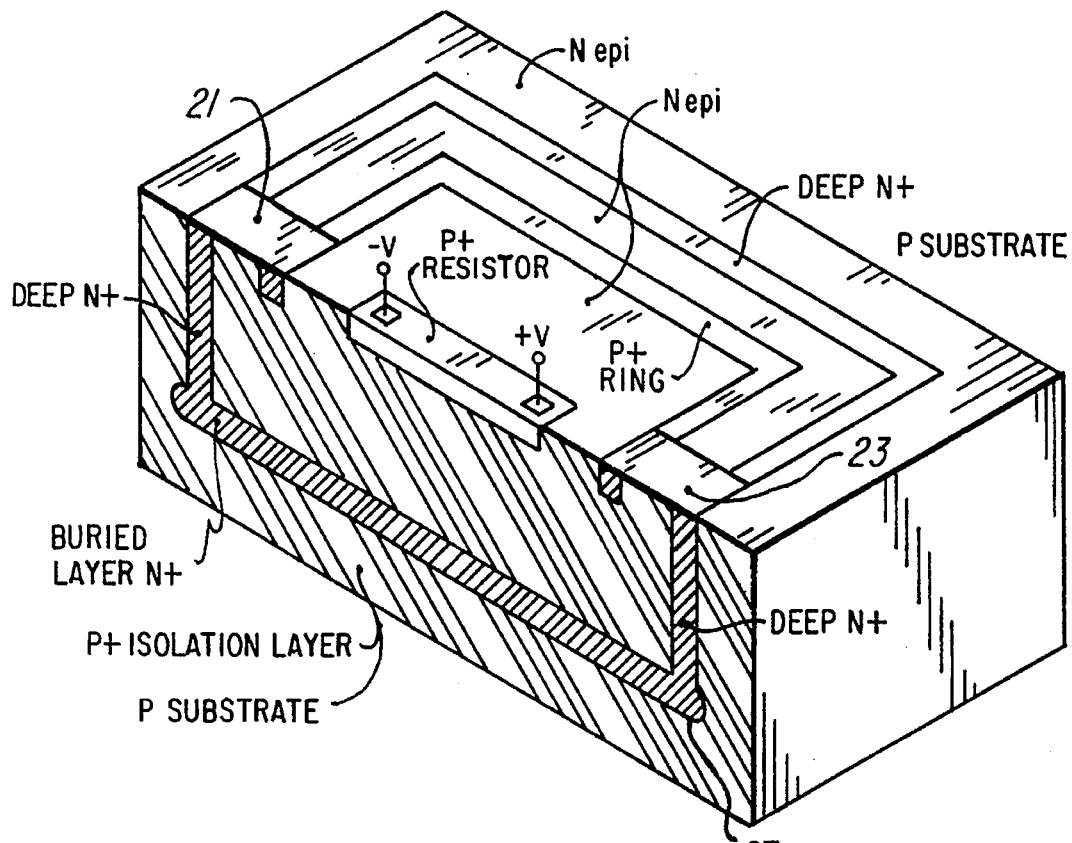
FIG. 2b. is a three quarter section view of the P+ resistor of FIG. 2a. showing the well formed by the deep N+ ring and the buried N+ layer.
Figure 2C:
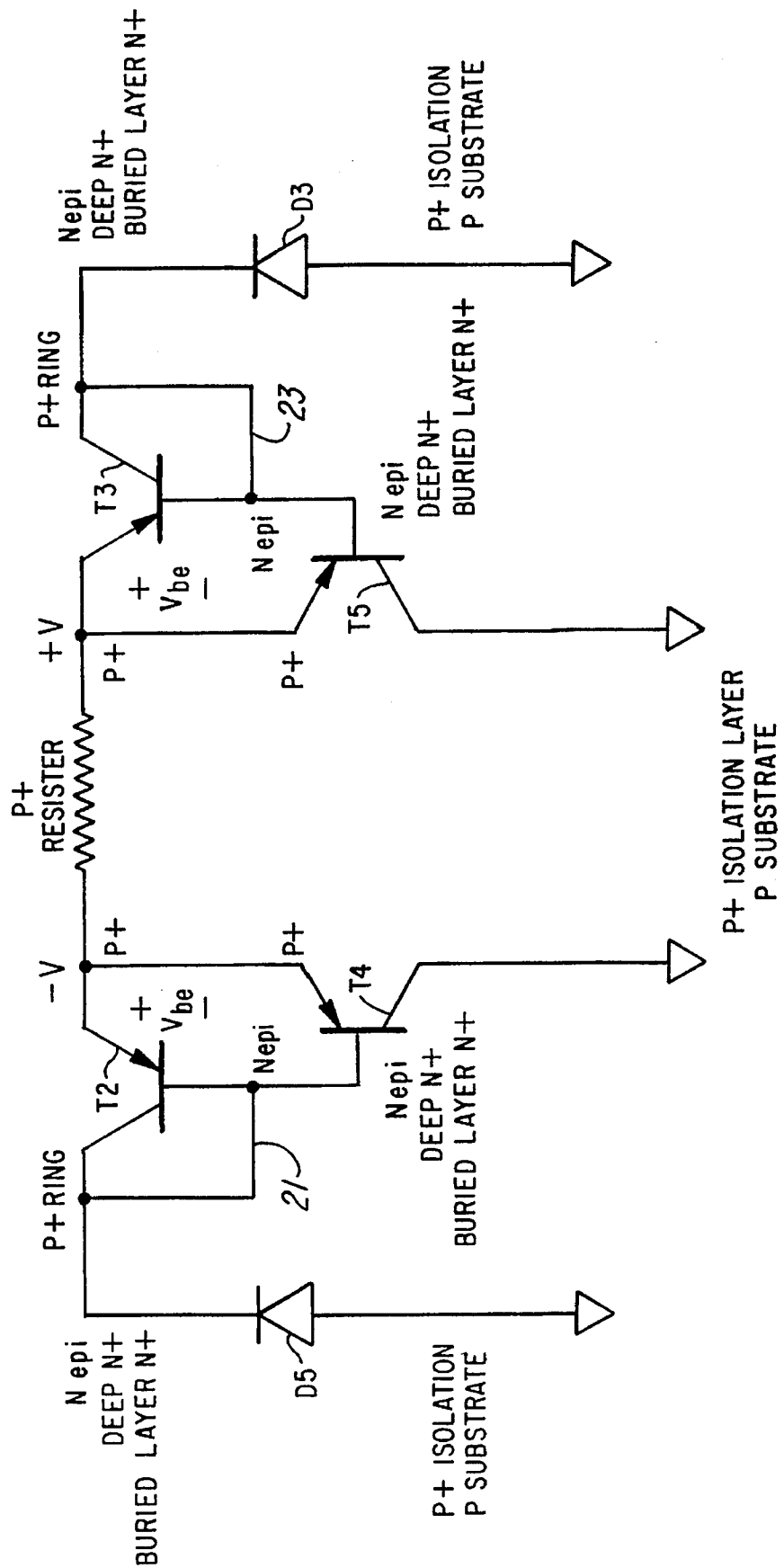

The inventive principles as shown for example in the preferred embodiment are disclosed in FIGS. 2a, 2b and 2c.

As shown in FIG. 2a in top view and FIG. 2b in side view, the P+ resistor material is located in the N epi isolation material. There is no connection between the P+ material and the N epi isolation material as shown by connection 15 in the prior art FIG. 1a, 1b and 1c. The N epi isolation material surrounding the P+ resistor is surrounded by a P+ ring extending into the N epi isolation material as shown in the side view of 2b, and in the preferred embodiment to the extent of the P+ resistor material. A connection shown as 21 and 23, connects the P+ ring to the deep N+ material. As seen in FIG. 2b, the deep N+ material is constructed in a ringed wall or Well 27 extending to the Buried Layer N+ material, in the preferred embodiment. The Well 27 may be seen as comprising the Deep N+ Layer and the Buried Layer N+, surrounding the P+ ring and P+ resistor.

The preferred embodiment, according to the inventive principles, is shown schematically in FIG. 2c. As shown, the P+ resistor has contacts +V and −V for connection to a circuit as would be understood by those skilled in the art. The transistor formed of the P+ material, the N epi isolation material and the P ring, shown by transistors T2 and T3 are shorted base to collector by connections 21 and 23, forming diodes biased in the forward direction from the P+ resistor material to the N epi material.

Parasitic transistors T4 and T5 are shown formed by the P+ material, the N epi material and the P+ isolation material and P substrate.

As can be seen by inspection, the operation of transistors T4 and T5, relative to the operation of transistors T2 and T3 are inefficient. This inefficiency is due to the large base width formed by the N epi material, and the presence of the well 27 formed of Deep N+ material and the Buried Layer N+ material, which reduces the transit of minority carriers from the P+ emitter to the P substrate collector, of parasitic transistors T4 and T5.

In normal operation, the voltage +V, will cause current to flow through the P+, N epi diode of T3 and connection 23 to the P+ ring and N epi, Deep N+ and N+ Buried layer. That current will be blocked by the diode D3 formed by the Deep N+, N epi and Buried layer N+ material and the P+ isolation material and P substrate. The base to emitter voltage drop ($V_{be}$) is negligible in T3 as the forward biased diode formed by the P+ material and N epi material in T3 acts like an open circuit. The base to emitter voltage ($V_{be}$) accordingly of parasitic transistor T5 will be insufficient to cause current to flow from the P+ emitter to P substrate collector of transistor T5. Further, transistor T5 is an inefficient transistor because of the large base width between the P+ resistor material and the P substrate and the presence of the Buried Layer, the Deep N+ material and the N epi layer which reduces the transit of carriers from the P+ material through to the P substrate material of transistor T5.

The operation of Transistor T2 at the lower voltage end of the P+ resistor Diode D5 and parasitic transistor T4 is similar to T3, D3 and T5 respectively, with less conduction due to the lower voltage present at the V− terminal of the P+ resistor.

Accordingly, as disclosed in the preferred embodiment with proper polarity connection, the IC shown in FIGS. 2a and 2b will conduct current through the P+ resistor material due to a voltage +V,−V. Conduction from the P+ material through to the substrate will be blocked through transistors T2 and T3 by the diodes D3 and D5 formed between the P substrate and Deep N+, N epi, and Buried Layer N+ materials. Further as described above, the parasitic transistors T4 and T5 will not conduct current from the +V and −V terminals of the P+ resistor for the reasons given above.

Where the voltage source to the IC is reversed in polarity such as for example where a battery is connected with its negative terminal to V+, and its positive terminal to the P substrate, no current will flow as can be seen by inspection. Current from the P substrate through diodes D3 and D5 will be blocked by the N epi, P+, base to emitter junctions formed by transistors T2 and T3. Further, current from the P substrate through the parasitic transistors T4 and T5 will be blocked by the N epi, P+ diodes formed by the N epi, Buried Layer N+ and Deep N+ materials and the P+ resistor materials.

As can be seen from the above description, an IC is shown as operating according to its intended function when connected with its correct polarity from its positive terminal to the positive terminal of a power source and with its negative terminal to the negative terminal of a power source. Further disclosed is the blockage or prevention of any current being conducted when the polarity from the power source is reverse connected to the IC such as when the negative terminal of the power source is connected to the positive terminal of the IC, and the positive terminal of the power source is connected to the negative terminal of the IC. The inventive principles shown within the novel construction of the preferred embodiment include a first semiconductor material having a designated polarity for connection to the same polarity of a power supply. As shown according to the novel construction in the preferred embodiment, a ring of the same designated semiconductor material polarity surrounds that first semiconductor material. A well of an opposite polarity semiconductor material is made to surround that ring, enclosing the ring and the first semiconductor material. Between the first semiconductor material and the ring and well is a semiconductor material opposite in polarity to the first semiconductor material and the ring.

We claim:

1. An electrical element within an isolation layer and arranged to prevent current flowing through said isolation layer, from said electrical element, when connected with reverse polarity to a power supply comprising:

an electrical element made of a first semiconductor material of a first polarity;

a second semiconductor material of opposite polarity to said first polarity;

said first semiconductor material is mounted in said second semiconductor material;

said second semiconductor material forming an isolation layer for said first semiconductor material;

a third semiconductor material of said first polarity mounted in said second semiconductor material and forming a ring around said first semiconductor material;

a fourth semiconductor material of said opposite polarity forming a well and said first semiconductor material, said second semiconductor material and third said semiconductor material is mounted in said well;

said third semiconductor material is connected to said fourth semiconductor material;

a substrate of said first semiconductor material;

said first semiconductor material, said second semiconductor material, said third semiconductor material and said fourth semiconductor material are mounted on said substrate;

a first [PN] junction formed by said substrate of said first semiconductor material and said fourth semiconductor material;

said first [PN] junction formed by said substrate of said first semiconductor material is reversed biased by a voltage of a first polarity applied to said first semiconductor material, relative to a voltage of a second polarity applied to said substrate;

and a second [PN] junction formed by said second semiconductor material and said first semiconductor material;

said second [PN] junction is reversed biased by said voltage of said second polarity applied to said first semiconductor material relative to said voltage of said first polarity applied to said substrate material;

whereby current flow is prevented between said electrical element and said substrate when said voltage of said first polarity is applied to said electrical element, and current flow is prevented between said substrate and said electrical element when a voltage of said second polarity relative to said first polarity, is applied to said electrical element.

2. The electrical element of claim 1, wherein:

said electrical element is a resistor.

3. The electrical element of claim 1, wherein:

a first transistor is formed of said electrical element; said second semiconductor material and said substrate;

the base of said first transistor is formed of said second semiconductor material;

a third [PN] junction is formed in said first transistor by said electrical element and said second semiconductor material and said fourth semiconductor material;

said first transistor current is responsive to the voltage drop across said second [PN] junction;

said second [PN] junction is connected in parallel with said third [PN] junction, whereby the current through said first transistor is reduced when said second [PN] junction is forward biased.

4. The electrical element of claim 3, wherein:

the width of said second and fourth semiconductor material form the base of said first transistor whereby the efficiency of said third transducer is reduced in proportion to the width of said base.

5. The electrical element of claim 3, wherein:

said well, forming the base of said first transistor, decreases the efficiency of said transistor proportionally to the width of the said base.

6. The electrical element of claim 1, wherein:

said first semiconductor material is a P-type material;

said second semiconductor material is an N-type material;

said third semiconductor material is a P-type material;

said fourth semiconductor material is an N-type material; and said substrate is a P-type material.

7. The electrical element of claim 3, including:

a second transistor is formed of said first semiconductor material, said third semiconductor material and said second semiconductor material;

said base of said second transistor is formed of said second semiconductor material; and said base of said second transistor is connected in common with said base of said first transistor.

8. The electrical element of claim 1 wherein:

said voltage of said first polarity is a positive voltage and said voltage of said second polarity is a negative voltage.

* * * * *